United States Patent
Lee et al.

(10) Patent No.: US 10,553,661 B2
(45) Date of Patent: Feb. 4, 2020

(54) DISPLAY SUBSTRATE AND DISPLAY APPARATUS INCLUDING THE SAME

(71) Applicant: Samsung Display Co., Ltd., Yongin-Si, Gyeonggi-Do (KR)

(72) Inventors: Sung-Eun Lee, Seoul (KR); Jin-Taek Kim, Yongin-si (KR); Ki-Wan Ahn, Seoul (KR); Joo-Sun Yoon, Seoul (KR); Yong-Jae Jang, Seoul (KR); Kwang-Young Choi, Incheon (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/713,983

(22) Filed: Sep. 25, 2017

(65) Prior Publication Data

US 2018/0122880 A1    May 3, 2018

(30) Foreign Application Priority Data

Nov. 3, 2016 (KR) .......................... 10-2016-0145851

(51) Int. Cl.
| | |
|---|---|
| H01L 27/32 | (2006.01) |
| G09G 3/3233 | (2016.01) |
| G09G 3/3291 | (2016.01) |
| H01L 27/12 | (2006.01) |

(52) U.S. Cl.
CPC ....... *H01L 27/3258* (2013.01); *G09G 3/3233* (2013.01); *G09G 3/3291* (2013.01); *H01L 27/124* (2013.01)

(58) Field of Classification Search
CPC ................ G09G 3/3233; G09G 3/3291; H01L 27/3258; H01L 27/124; H01L 27/3265
USPC ..................................................... 257/40, 288
See application file for complete search history.

(56) References Cited

U.S. PATENT DOCUMENTS

RE46,080 E    7/2016 Maurer et al.

OTHER PUBLICATIONS

American Heritage Dictionary definition of "overlap." No Date.*

* cited by examiner

*Primary Examiner* — Hrayr A Sayadian
(74) *Attorney, Agent, or Firm* — Cantor Colburn LLP (57) ABSTRACT

A display substrate includes a data line extending in a first direction, a first transistor including a first channel area overlapping the data line and a first control electrode which overlaps the first channel area and has a substantially same shape as that of the first channel area in an overlap area in which the first control electrode overlaps the first channel area, a scan line extending in a second direction crossing the first direction, a first voltage line extending in the first direction and transfers a first driving signal, a first capacitor including an extension electrode which overlaps the first control electrode and extends in the second direction from the first voltage line and a second capacitor including an overlap electrode overlapping the data line.

20 Claims, 10 Drawing Sheets

DISPLAY SUBSTRATE AND DISPLAY APPARATUS INCLUDING THE SAME

This application claims priority to Korean Patent Application No. 10-2016-0145851, filed on Nov. 3, 2016, and all the benefits accruing therefrom under 35 U.S.C. § 119, the content of which in its entirety is herein incorporated by reference.

BACKGROUND

1. Field

Exemplary embodiments of the invention relate to a display substrate and a display apparatus including the display substrate. More particularly, exemplary embodiments of the invention relate to a display substrate for improving a display quality and a display apparatus including the display substrate.

2. Description of the Related Art

Recently, various types of flat panel display devices that improve upon disadvantages of a cathode ray tube ("CRT"), such as a heavy weight and a large volume, have been developed. The flat panel display devices include a liquid crystal display ("LCD") device, a field emission display ("FED") device, a plasma display panel ("PDP"), an organic light emitting display device, etc.

The organic light emitting display device has various advantages such as rapid response speed and low power consumption because the organic light emitting display device among the flat panel display devices displays an image using an organic light emitting diode ("OLED") that emits a light based on recombination of electrons and holes.

SUMMARY

Exemplary embodiments of the invention provide a display substrate for improving a display quality.

Exemplary embodiments of the invention provide a display apparatus including the display substrate.

According to an exemplary embodiment of the invention, there is provided a display substrate. The display substrate includes a data line extending in a first direction, a first transistor including a first channel area overlapping the data line and a first control electrode which overlaps the first channel area and has a substantially same shape as that of the first channel area in an overlap area in which the first control electrode overlaps the first channel area, a scan line extending in a second direction crossing the first direction, a first voltage line which extends in the first direction and transfers a first driving signal, a first capacitor including an extension electrode which overlaps the first control electrode and extends in the second direction from the first voltage line, and a second capacitor including an overlap electrode overlapping the data line.

In an exemplary embodiment, the display substrate may further include a second voltage line which is connected to the first transistor and transfers the first power source signal, where the data line is disposed between the first voltage line and the second voltage line adjacent to the first voltage line in the second direction.

In an exemplary embodiment, the display substrate may further include a second transistor including a second control electrode connected to the scan line, a first electrode connected to the first control electrode and a second electrode connected to the overlap electrode, a third voltage line which is parallel with the scan line and transfers a second driving signal, and a third transistor including a third control electrode connected to the third voltage line, a first electrode connected to the first voltage line and a second electrode connected to the overlap electrode.

In an exemplary embodiment, the display substrate may further include a first insulating interlayer disposed between the first control electrode and the extension electrode, and including a high dielectric constant material.

In an exemplary embodiment, the display substrate may further include a second insulating interlayer disposed between the extension electrode and the data line and a third insulating interlayer disposed between the data line and the overlap electrode.

In an exemplary embodiment, the display substrate may further include an organic light emitting diode including an anode electrode connected to the overlap electrode, a cathode electrode which receives a second power source signal and an organic light emitting layer disposed between the anode electrode and the cathode electrode.

According to an exemplary embodiment of the invention, there is provided a display apparatus. The display apparatus includes a first display substrate including an m-th data line extending in a first direction, a first transistor including a first channel area overlapping the m-th data line and a first control electrode which overlaps the first channel area and has a substantially same shape as that of the first channel area in an overlap area in which the first control electrode overlaps the first channel area, an n-th scan line extending in a second direction crossing the first direction, a first capacitor including an extension electrode overlapping the first control electrode, a second capacitor including an overlap electrode overlapping the m-th data line, and an organic light emitting diode including an anode electrode connected to the overlap electrode and an organic light emitting layer, and a second display substrate opposing to the first display substrate.

In an exemplary embodiment, the first display substrate may further include a first voltage line which extends in the first direction and transfers a first driving signal, and a second voltage line which is connected to the first transistor and transfers the first power source signal, where the m-th data line is disposed between the first voltage line and the second voltage line adjacent to the first voltage line in the second direction.

In an exemplary embodiment, the first display substrate may further include a second transistor including a second control electrode connected to the scan line, a first electrode connected to the first control electrode and a second electrode connected to the overlap electrode, a third voltage line which is parallel with the scan line and transfers a second driving signal and a third transistor including a third control electrode connected to the third voltage line, a first electrode connected to the first voltage line and a second electrode connected to the overlap electrode.

In an exemplary embodiment, the first display substrate may further include a first insulating interlayer disposed between the first control electrode and the extension electrode, where the first insulating interlayer includes a high dielectric constant material.

In an exemplary embodiment, the first display substrate may further include a second insulating interlayer disposed between the extension electrode and the m-th data line and a third insulating interlayer disposed between the m-th data line and the overlap electrode.

In an exemplary embodiment, during a first period of a frame period, the first voltage line may receive a low voltage of the first driving signal, the second voltage line may receive a high voltage of the first power source signal, the third voltage line may receive a high voltage of the second driving signal, and the n-th scan line may receive a high voltage of the scan signal.

In an exemplary embodiment, during a second period of the frame period, the first voltage line may receive the low voltage of the first driving signal, the second voltage line may receive a low voltage of the first power source signal lower than the low voltage of the first driving signal, the third voltage line may receive a low voltage of the second driving signal, and the n-th scan line may receive the high voltage of the scan signal.

In an exemplary embodiment, during a third period of the frame period, the first voltage line may receive the low voltage of the first driving signal, the second voltage line may receive the high voltage of the first power source signal, the third voltage line may receive the low voltage of the second driving signal, the n-th scan line may receive the high voltage of the scan signal during an n-th horizontal period of the third period, and the m-th data line may receive a data voltage corresponding to an n-th horizontal line.

In an exemplary embodiment, during the n-th horizontal period, the first and second capacitors may be connected to each other in series, where the data voltage corresponding to the n-th horizontal line may be divided by a voltage division ratio of the first and second capacitors and the divided data voltage may be applied to the first control electrode.

In an exemplary embodiment, the m-th data line may receive a reference voltage before a data voltage corresponding to a first horizontal line of a plurality of horizontal lines is applied to the m-th data line, and after a data voltage corresponding to a last horizontal line of the plurality of horizontal lines is applied to the m-th data line.

In an exemplary embodiment, the m-th data line may receive the reference voltage before the first voltage line receives the high voltage of the first driving signal, where the reference voltage may be equal to or lower than a lowest voltage of a data voltage range.

In an exemplary embodiment, during a fourth period of the frame period, the first voltage line may receive a high voltage of the first driving signal, the second voltage line may receive the high voltage of the first power source signal, the third voltage line may receive the low voltage of the second driving signal, and the n-th scan line may receive a low voltage of the scan signal.

In an exemplary embodiment, a difference voltage between the high voltage and the low voltage of the first driving signal may be applied to the first control electrode, and a driving current corresponding to the data voltage which is applied to the first control electrode may be applied to the organic light emitting diode when the first transistor is turned on.

In an exemplary embodiment, the first transistor in the first display substrate may be an N-type transistor.

According to the invention, in the pixel structure of the high resolution including the data line overlapping a control electrode of the first transistor, the control electrode has a substantially same shape as that of the channel area of the first transistor overlapping the control electrode so that an overlap area of the data line and the channel area may decrease. Therefore, the parasitic capacitance occurring by the control electrode and the data line may decrease and thus, the display quality may be improved.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION

Hereinafter, the invention will be explained in detail with reference to the accompanying drawings. This invention may, however, be embodied in many different forms, and should not be construed as limited to the embodiments set forth herein. Rather, these embodiments are provided so that this invention will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein The terminology used herein is for the purpose of describing particular embodiments only and is not intended to be limiting. As used herein, the singular forms "a," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 1:
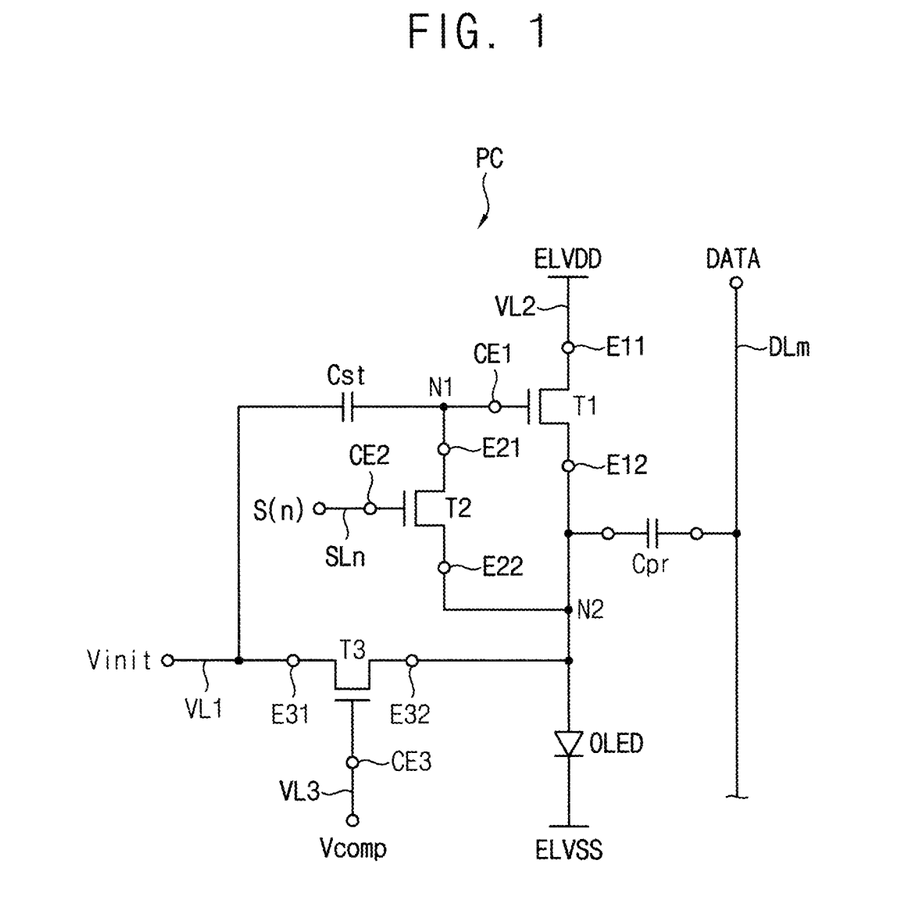
FIG. 1 is a circuit diagram illustrating an exemplary embodiment of a pixel circuit.

FIG. 1 is a circuit diagram illustrating a pixel circuit according to an exemplary embodiment.

Referring to FIG. 1, the pixel circuit PC of a high resolution may include a first transistor T1, a second transistor T2, a third transistor T3, a first capacitor Cst, a second capacitor Cpr and an organic light emitting diode OLED.

According to the exemplary embodiment, the first, second and third transistors T1, T2 and T3 may be an N-type transistor, for example. Each of the first, second and third transistors T1, T2 and T3, which are the N-type transistors, is turned on when a high voltage is applied to a control electrode and is turned off when a low voltage is applied to the control electrode. In the exemplary embodiment, the high voltage may be an ON voltage for turning on the transistor, and the low voltage may be an OFF voltage for turning off the transistor, for example.

The first transistor T1 may include a first control electrode CE1 connected to a first node N1, a first electrode E11 connected to a second voltage line VL2 and a second electrode E12 connected to a second node N2. The second voltage line VL2 receives a first power source signal ELVDD.

The first power source signal ELVDD may have a high voltage corresponding to a normal power source voltage and a low voltage which is predetermined for driving the pixel circuit PC. The first power source signal ELVDD may have the low voltage during a compensation period during which a threshold voltage of the first transistor T1 is compensated and have the high voltage during a remaining period of the frame period except for the compensation period.

The second transistor T2 may include a second control electrode CE2 connected to an n-th scan line SLn, a first electrode E21 connected to the first node N1 and a second electrode E22 connected to the second node N2. The n-th scan line SLn receives an n-th scan signal S(n). The n-th scan signal S(n) has a high voltage for turning on the second transistor T2 and a low voltage for turning off the second transistor T2. The second transistor T2 may diode-couple the first transistor T1 during the compensating period.

The third transistor T3 may include a third control electrode CE3 connected to a third voltage line VL3, a first electrode E31 connected to a first voltage line VL1 and a second electrode E32 connected to the second node N2. The first voltage line VL1 receives a first driving signal Vinit.

The first driving signal Vinit may have a high voltage and a low voltage which are predetermined for driving the pixel circuit PC. The first driving signal Vinit may have the high voltage during an emission period during which the organic light emitting diode OLED emits a light and have a low voltage during a remaining period of the frame period except for the emission period.

The third voltage line VL3 receives a second driving signal Vcomp. The second driving signal Vcomp may have a high voltage for turning on the third transistor T3 and a low voltage for turning off the third transistor T3.

The first capacitor Cst is connected to the first voltage line VL1 and the first node N1. The first capacitor Cst may store a voltage applied to the first node N1.

The second capacitor Cpr is connected to the second node N2 and an m-th data line DLm. The second capacitor Cpr may store a data voltage DATA applied to the m-th data line DLm.

The first and second capacitors Cst and Cpr may be connected to the first node N1 in series when the second transistor T2 is turned on, and the data voltage DATA is divided by a resistance ratio of the first and second capacitors Cst and Cpr. Then, divided data voltage DATA may be applied to the first node N1.

The organic light emitting diode OLED may include an anode electrode connected to the second node N2 and a cathode electrode which receives the second power voltage ELVSS.

When the first transistor T1 is turned on, a driving current corresponding to the data voltage DATA applied to the first node N1 is applied to the organic light emitting diode OLED. Then, the organic light emitting diode OLED may emit the light.

Although not shown in drawings, at least one of the second and third transistors T2 and T3 may have a dual gate structure to avoid a leakage current.

Figure 2:
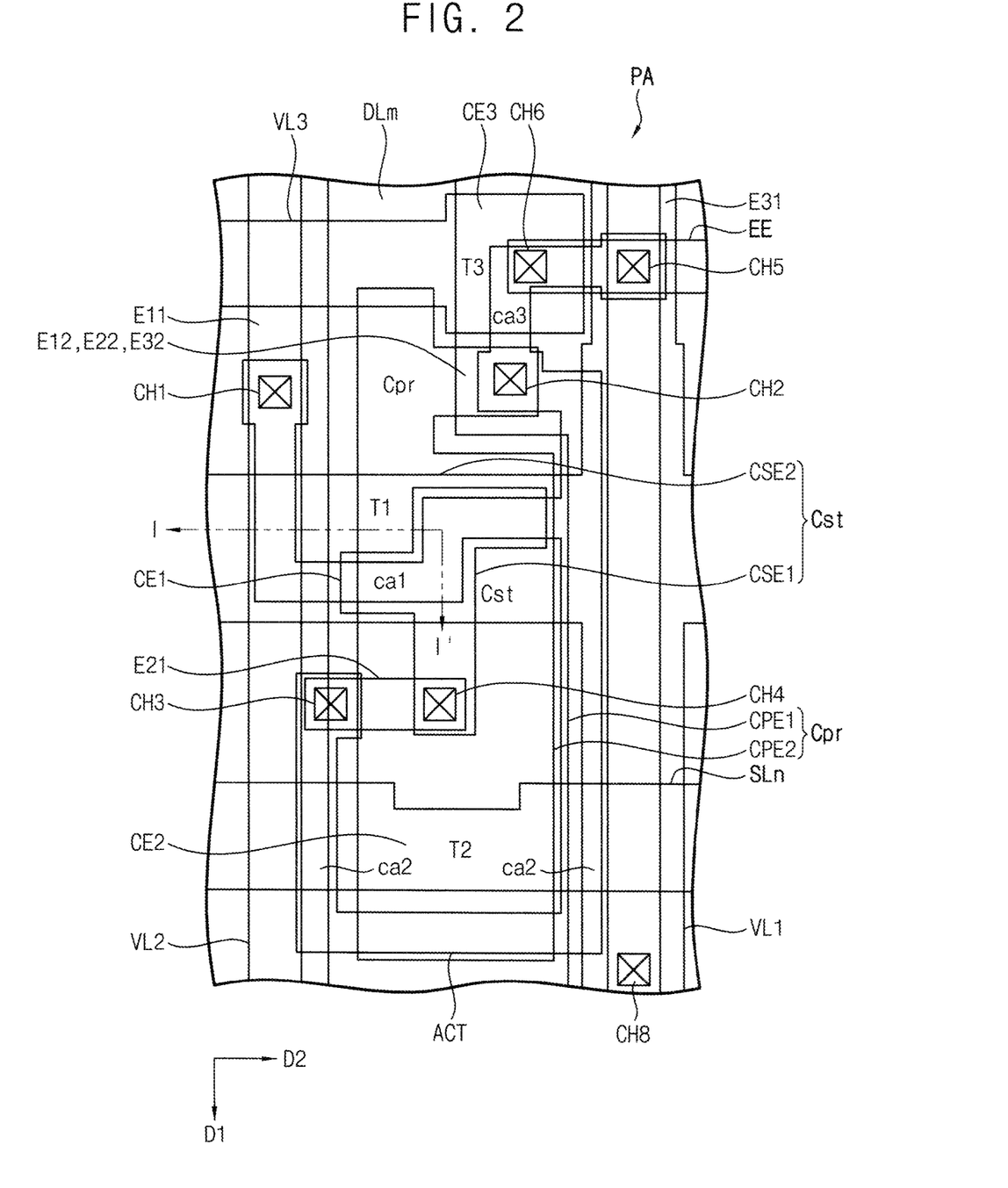
FIG. 2 is a plan view illustrating an exemplary embodiment of a pixel circuit.

FIG. 2 is a plan view illustrating a pixel circuit according to an exemplary embodiment.

Referring to FIGS. 1 and 2, the pixel circuit of the high resolution is disposed in a pixel circuit area PA. The pixel circuit may include a first voltage line VL1, a second voltage line VL2, a third voltage line VL3, an n-th scan line SLn, an m-th data line DLm, a first transistor T1, a second transistor T2, a third transistor T3, a first capacitor Cst and a second capacitor Cpr.

The first voltage line VL1 transfers a first driving signal Vinit and extends in the first direction D1.

The second voltage line VL2 transfers a first power source signal ELVDD and extends in the first direction D1.

The third voltage line VL3 transfers a second driving signal Vcomp and extends in the second direction D2.

The n-th scan line SLn transfers an n-th scan signal S(n) and extends in the second direction D2.

The m-th data line DLm transfers a data voltage DATA and extends in the first direction D1. The m-th data line DLm is disposed substantially in a central area of the pixel circuit area PA. As shown in FIG. 2, the m-th data line DLm may be disposed between the first and second voltage lines VL1 and VL2.

The first transistor T1 may include a first control electrode CE1, a first electrode E11 and a second electrode E12. The first control electrode CE1 may be disposed as an island shape in the central area of the pixel circuit area PA. The first electrode E11 may be defined in a portion area of the second voltage line VL2 which is connected to an active pattern ACT through a first contact part CH1. The second electrode E12 may be defined in a portion area of the second capacitor Cpr which is connected to an active pattern ACT through a second contact part CH2. The first control electrode CE1 may overlap a first channel area ca1 of the active pattern ACT and have a substantially same shape as that of the first channel area ca1.

The second transistor T2 may include a second control electrode CE2, a first electrode E21 and a second electrode E22. The second control electrode CE2 may be defined in a portion area of the n-th scan line SLn. The first electrode E21 may be defined as an electrode which is connected to an active pattern ACT through a third contact part CH3. The second electrode E22 may be defined in a portion area of the second capacitor Cpr which is connected to an active pattern ACT through the second contact part CH2. The first electrode E21 may be connected to the first control electrode CE1 of the first transistor T1 through a fourth contact part CH4. The second control electrode CE2 may overlap a second channel area ca2 of the active pattern ACT. As shown in FIG. 2, the second transistor T2 may have a dual gate structure which includes the second control electrode CE2 overlapping two second channel areas ca2.

The third transistor T3 may include a third control electrode CE3, a first electrode E31, and a second electrode E32. The third control electrode CE3 may be defined in a portion area of the third voltage line VL3. The first electrode E31 may be defined in a portion area of the third voltage line VL3 which is connected to the active pattern ACT through a fifth contact part CH5. The second electrode E32 may be defined in a portion area of the second capacitor Cpr which is connected to the active pattern ACT through the second contact part CH2. The third control electrode CE3 may overlap a third channel area ca3 of the active pattern ACT.

The third voltage line VL3 may be connected to a third voltage line VL3 which is disposed in an adjacent pixel circuit area through a sixth contact part CH6 and a connection electrode EE.

The first capacitor Cst may include an extension electrode which is connected to the first voltage line VL1 and extends in the second direction D2 from the first voltage line VL1. The first capacitor Cst may be defined by the extension electrode and the first control electrode CE1 of the first transistor T1 overlapping the extension electrode. The first capacitor Cst may include a first capacitor electrode CSE1 and a second capacitor electrode CSE2 which overlap each other. According to the exemplary embodiment, the first capacitor electrode CSE1 may be the first control electrode CE1 and the second capacitor electrode CSE2 may be the extension electrode extending from the first voltage line VL1.

The second capacitor Cpr may include an overlap electrode which overlaps the m-th data line DLm, and may be defined by the overlap electrode and the m-th data line DLm which overlap the overlap electrode. The second capacitor Cpr may include a third capacitor electrode CPE1 and a fourth capacitor electrode CPE2 which overlap each other. According to the exemplary embodiment, the third capacitor electrode CPE1 may be the m-th data line DLm and the fourth capacitor electrode CPE2 may be the overlap electrode.

According to the exemplary embodiment, the first control electrode CE1 of the first transistor T1 has a substantially same shape as that of the first channel area ca1 which overlaps the first control electrode CE1 so that an overlap area of the first control electrode CE1 and the m-th data line DLm may decrease and a parasitic capacitance of the first control electrode CE1 and the m-th data line DLm may decrease. Thus, luminance defects between pixels connected to the m-th data line DLm may be decreased and eliminated.

Figure 3:
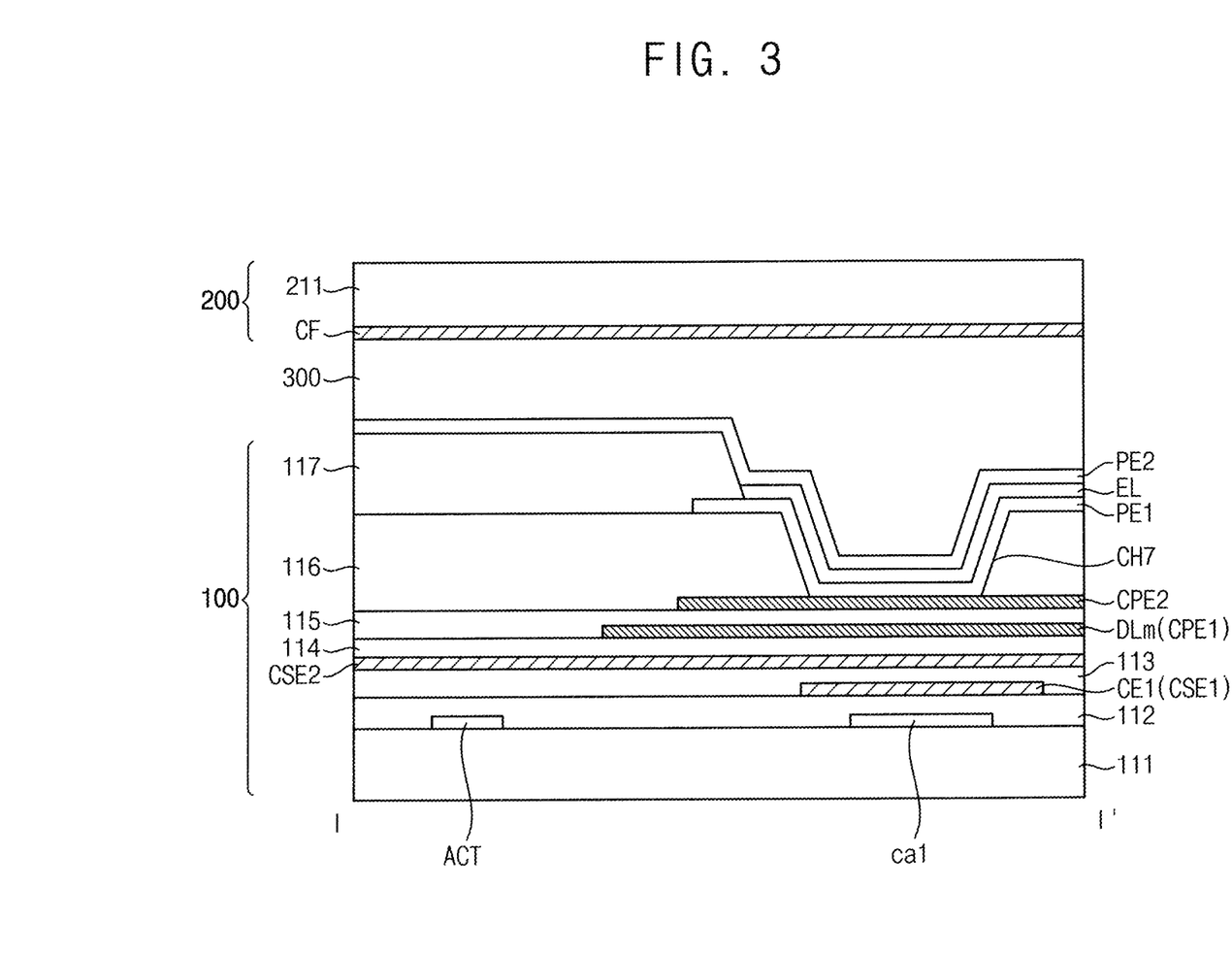
FIG. 3 is a cross-sectional view taken along line I-I' of the exemplary embodiment of the pixel circuit of FIG. 2.

FIG. 3 is a cross-sectional view taken along line I-I' of FIG. 2 according to an exemplary embodiment. FIGS. 4 to 8 are cross-sectional views illustrating a method of manufacturing a display apparatus according to an exemplary embodiment.

Figure 4:
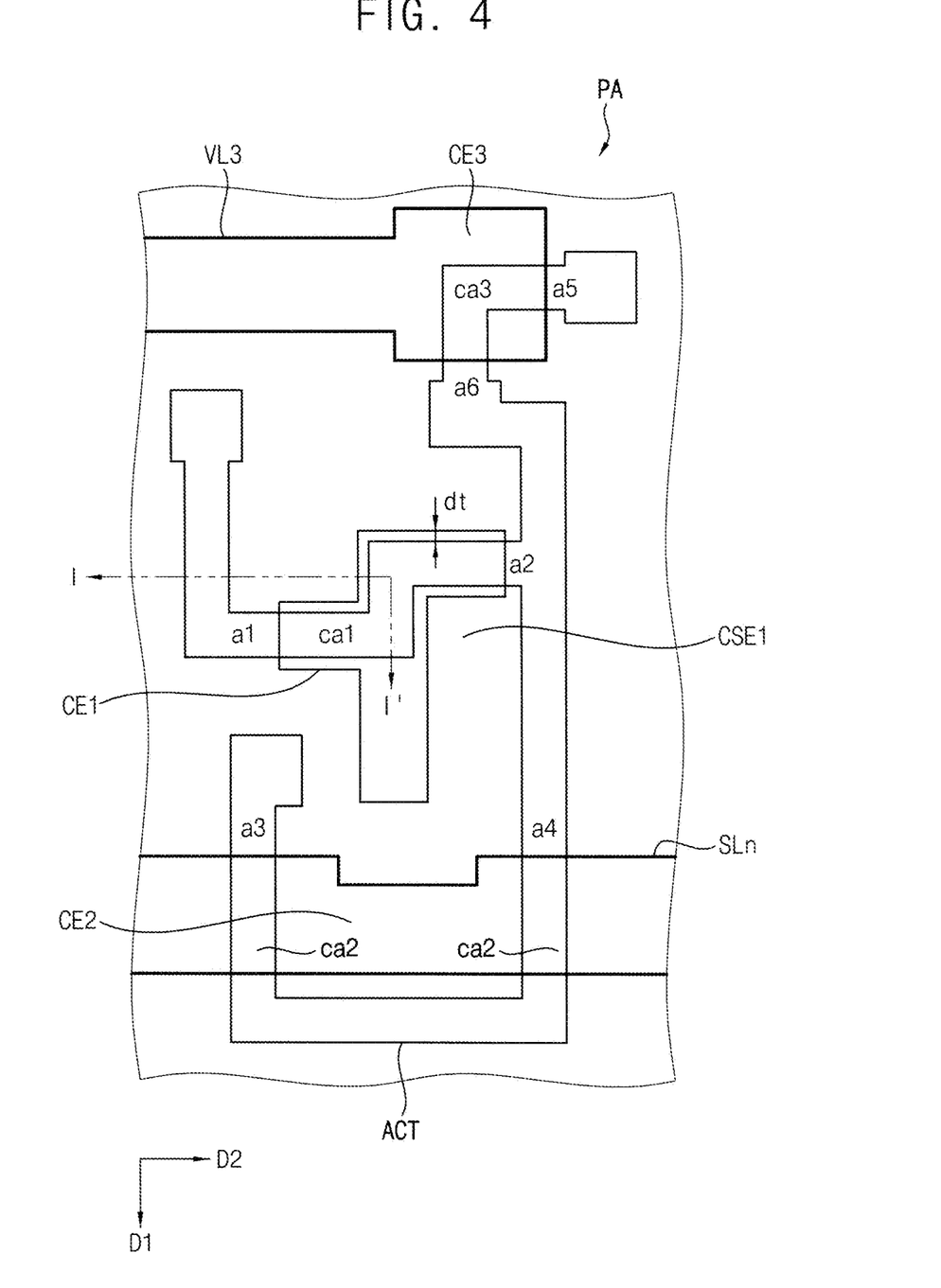
FIGS. 4 to 8 are cross-sectional views illustrating an exemplary embodiment of a method of manufacturing a display apparatus.

Referring to FIGS. 2, 3 and 4, the display apparatus may include a first display substrate 100, a second display substrate 200 opposing the first display substrate 100 and a spacer coating layer 300 disposed between the first and second display substrates 100 and 200.

The first display substrate 100 may include a first base substrate 111.

The base substrate 111 may include an insulation material. In an exemplary embodiment, the base substrate 111 may include a glass, a transparent plastic, a transparent metal oxide, etc., for example.

The active pattern ACT may be disposed on the base substrate 111. The active pattern ACT may include silicon. In an alternative exemplary embodiment, the active pattern ACT may include a semiconductor oxide including a binary compound (ABx), a ternary compound (ABxCy), a quaternary compound (ABxCyDz), etc., which include indium, zinc, gallium, tin, titanium, aluminum, hafnium (Hf), zirconium (Zr), magnesium (Mg), etc., for example. These compounds may be used alone or in combination thereof.

The active pattern ACT may include first to sixth areas a1, a2, a3, a4, a5 and a6 and first to third channel areas ca1, ca2 and ca3.

The first to sixth areas a1, a2, a3, a4, a5 and a6 may be doped with an impurity. The first to sixth areas a1, a2, a3, a4, a5 and a6 may be first and second electrodes of first, second and third transistors T1, T2 and T3.

The first channel area ca1 may be disposed between the first and second areas a1 and a2, and correspond to a first channel area of the first transistor T1. The second channel area ca2 may be disposed between the third and fourth areas a3 and a4 and correspond to a second channel area of the second transistor T2. The third channel area ca3 may be disposed between the fifth and sixth areas a5 and a6 and correspond to a third channel area of the third transistor T3.

A gate insulating layer 112 may be disposed on the active pattern ACT. The gate insulating layer 112 may include a silicon compound, metal oxide, etc. In an exemplary embodiment, the gate insulation layer may include silicon oxide, silicon nitride, silicon oxynitride, aluminum oxide, tantalum oxide, hafnium oxide, zirconium oxide, titanium oxide, etc., for example, which may be used alone or in combination thereof. In an exemplary embodiment, the gate insulation layer 112 may have a multilayer structure including a silicon oxide layer and silicon nitride layer, for example.

A first conductive pattern which is patterned from a first conductive layer may be disposed on the gate insulating layer 112. The first conductive layer may include metal, alloy, metal nitride, conductive metal oxide, transparent conductive material, etc., which may be used alone or in combination thereof.

The first conductive pattern may include the n-th scan line SLn, the control electrode CE2 of the second transistor T2, the third voltage line VL3, the control electrode CE3 of the third transistor T3, the control electrode CE1 of the first transistor T1, and the first capacitor electrode CSE1 of the first capacitor Cst.

The n-th scan line SLn may extend in the second direction D2.

The first control electrode CE1 of the first transistor T1 is disposed as an island shape in a central area of the pixel circuit area PA, and has a substantially same shape as that of the first channel area ca1 which overlaps the first control electrode CE1. The first control electrode CE1 may fully cover the first channel area ca1. A distance dt of an edge portion of the first channel area ca1 and an edge portion of the first control electrode CE1 may be less than about 0.5 micrometers (μm), for example.

The second control electrode CE2 of the second transistor T2 may be defined in a portion area of the n-th scan line SLn.

The control electrode CE3 of the third transistor T3 may be defined in a portion area of the third voltage line VL3.

The third voltage line VL3 may be disposed in parallel with the n-th scan line SLn.

The first capacitor electrode CSE1 of the first capacitor Cst may be defined in a portion area of the control electrode CE1.

Figure 5:
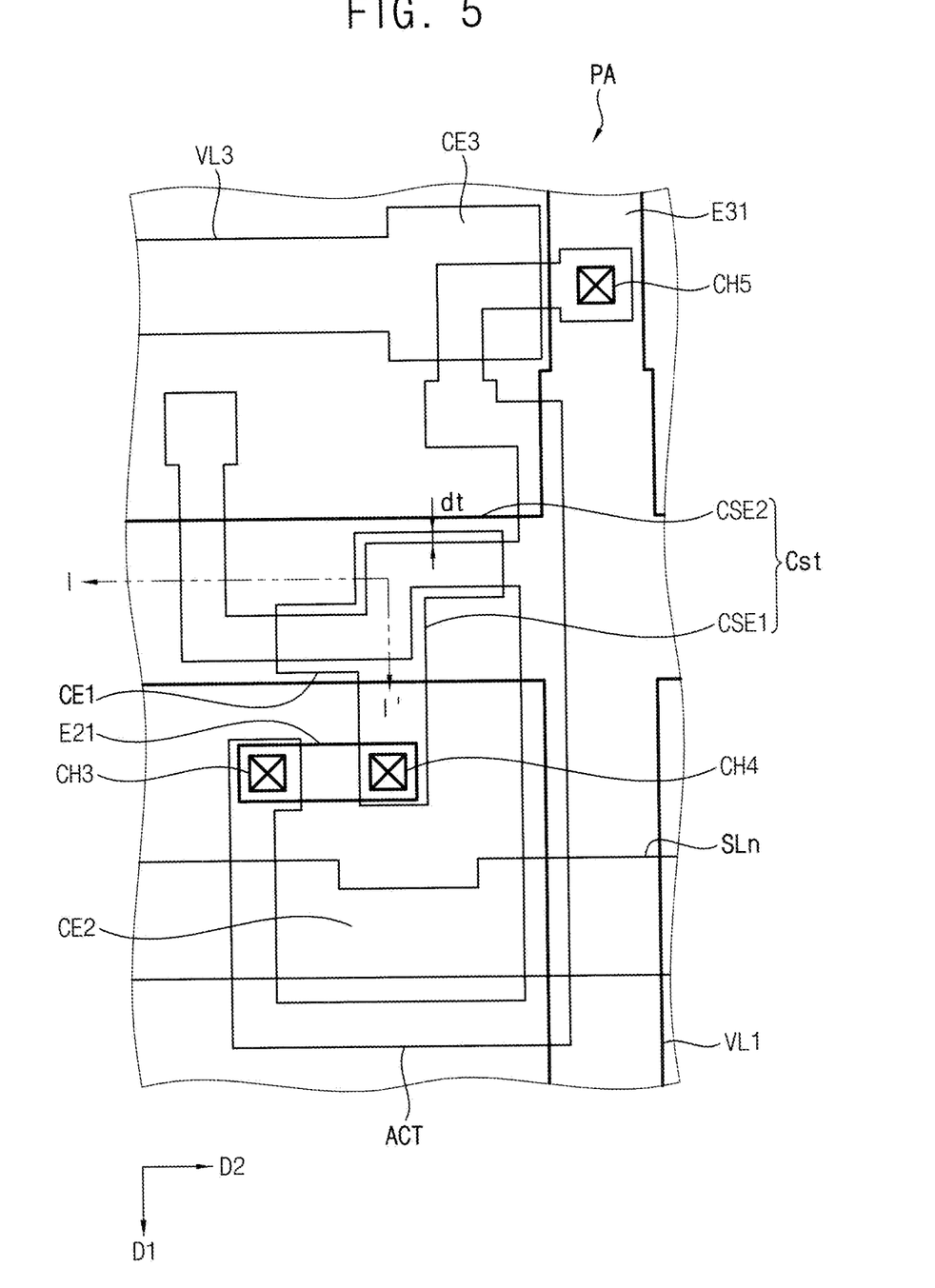

Referring to FIGS. 2, 3 and 5, a first insulating interlayer 113 may be disposed on the first conductive pattern. In an exemplary embodiment, the first insulating interlayer 113 may include a silicon oxide, a silicon nitride, a silicon oxynitride, and etc, for example. These may be used alone or in combination with each other.

According to the exemplary embodiment, the first insulating interlayer 113 may include a high dielectric constant material (high-k) so that capacitance-reduction according to area-reduction of the first control electrode CE1 of the first transistor T1 may be compensated.

In an exemplary embodiment, the high dielectric constant material may include ZrOx, AlOx, etc., for example.

A third contact part CH3, a fourth contact part CH4 and a fifth contact part CH5 may be defined in the pixel circuit area PA. The gate insulation layer 112 and the first insulating interlayer 113 are etched to define the third and fifth contact parts CH3 and CH5. The insulating interlayer 113 are etched to define the fourth contact part CH4.

A second conductive pattern which is patterned from a second conductive layer, may be disposed on the first insulating interlayer 113. The second conductive layer metal, alloy, metal nitride, conductive metal oxide, transparent conductive material, etc., which may be used alone or in combination thereof.

The second conductive pattern may include the first voltage line VL1, a second capacitor electrode CSE2 of the first capacitor Cst, a first electrode E21 of the second transistor T2 and the first electrode E31 of the third transistor T3.

The first voltage line VL1 may extend in the first direction D1.

The second capacitor electrode CSE2 of the first capacitor Cst may be connected to the first voltage line VL1 and extend in the second direction D2 from the first voltage line VL1. The first capacitor Cst may be defined by the first electrode CSE1 of the first conductive pattern and the second capacitor electrode CSE2 of the second conductive pattern overlapping the first electrode CSE1.

A first end portion of the first electrode E21 may be connected to the active pattern ACT through the third contact part CH3 and a second end portion of the first electrode E21 may be connected to the control electrode CE1 of the first transistor T1 through the fourth contact part CH4.

The first electrode E31 of the third transistor T3 may be defined in a portion area of the first voltage line VL1 and be connected to the active pattern ACT through the fifth contact part CH5.

Figure 6:
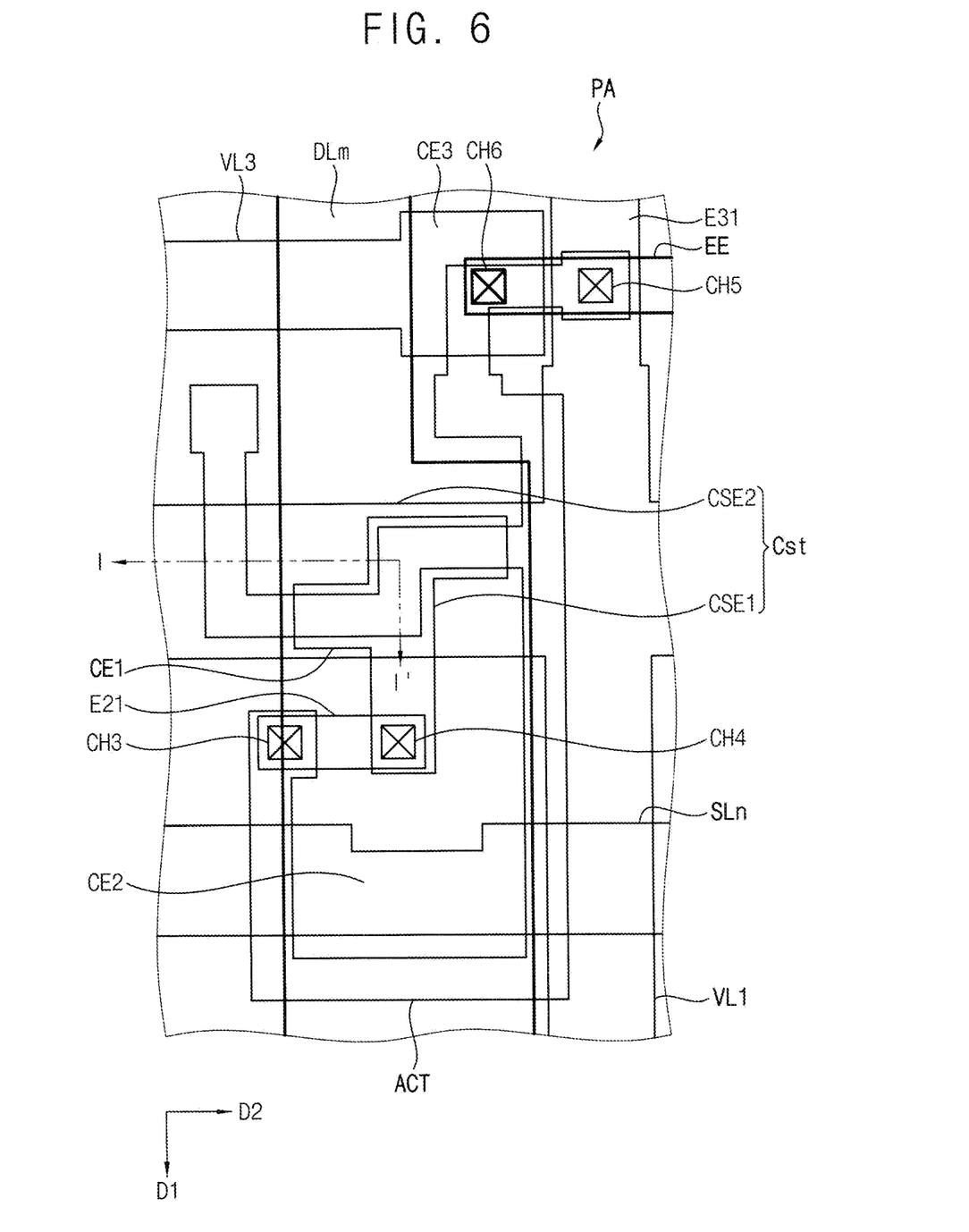

Referring to FIGS. 2, 3 and 6, a second insulating interlayer 114 may be disposed on the second conductive pattern. The pixel circuit area PA may include a sixth contact part CH6 in which the first and second insulating interlayers 113 and 114 are etched.

A third conductive pattern which is patterned from a third conductive layer, may be disposed on the second insulating interlayer 114. The third conductive pattern may include the m-th data line DLm, a third capacitor electrode CPE1 of the second capacitor Cpr and a connection electrode EE.

The m-th data line DLm may extend in the first direction D1 and be disposed in the central area of the pixel circuit area PA.

The third capacitor electrode CPE1 of the second capacitor Cpr may extend from the m-th data line DLm.

The connection electrode EE may be connected to the third voltage line VL3 and a third voltage line VL3 which is disposed in an adjacent pixel circuit area, through the sixth contact part CH6.

Figure 7:
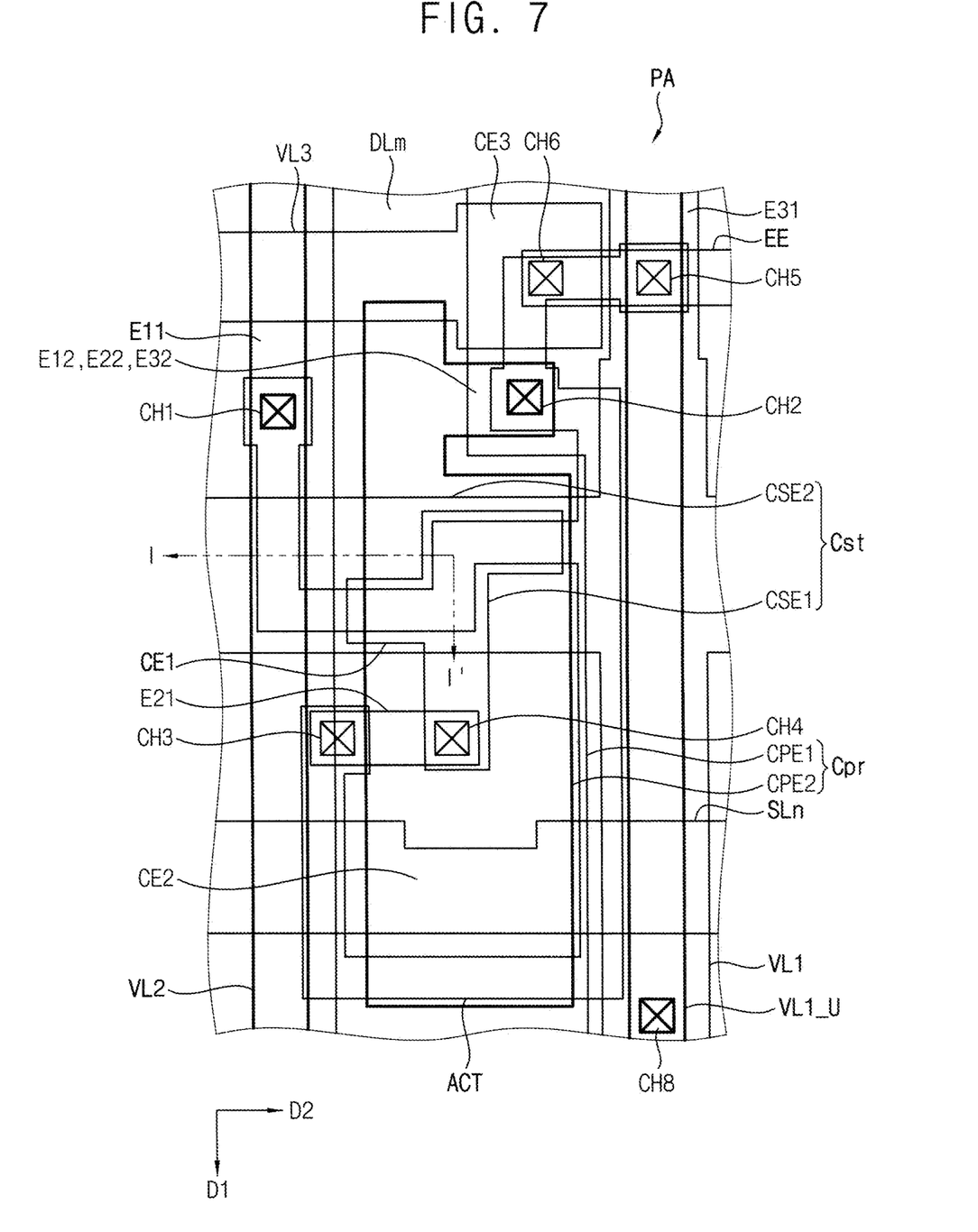

Referring to FIGS. 2, 3 and 7, a third insulating interlayer 115 may be disposed on the third conductive pattern. A first contact part CH1 and a second contact part CH2 in which the gate insulating layer 112, the first insulating interlayer 113, the second insulating interlayer 114 and the third insulating interlayer 115 are etched may be defined in the pixel circuit area PA.

A fourth conductive pattern which is patterned from a fourth conductive layer may be disposed on the third insulating interlayer 115.

The fourth conductive pattern may include the second voltage line VL2, the first electrode E11 of the first transistor T1, a fourth capacitor electrode CPE2 of the second capacitor Cpr, the second electrode E12 of the first transistor T1, the second electrode E22 of the second transistor T2 and the second electrode E32 of the third transistor T3. As shown in FIG. 7, the fourth conductive pattern may further include a first voltage line VL1_U overlapping the first voltage line VL1. The first voltage line VL1_U may be connected to the first voltage line VL1 of the second conductive pattern through a contact part CH8 and have a double-line structure.

The second voltage line VL2 may extend in the first direction D1 and may define a width of the pixel circuit area along the first direction D1 together with the first voltage line VL1 in the adjacent pixel circuit area PA.

The first electrode E11 of the first transistor T1 may be defined in a portion area of the second voltage line VL2 connected to the active pattern ACT through the first contact part CH1.

The fourth capacitor electrode CPE2 of the second capacitor Cpr may have an island shape and be disposed in the central area of the pixel circuit area PA. The second capacitor Cpr may be defined by the third capacitor electrode CPE1 of the third conductive pattern and the fourth capacitor electrode CPE2 of the fourth conductive pattern overlapping the third capacitor electrode CPE1.

The second electrode E12 of the first transistor T1, the second electrode E22 of the second transistor T2 and the second electrode E32 of the third transistor T3 may defined in a portion area of the fourth capacitor electrode CPE2 connected to the active pattern ACT through the second contact part CH2.

Figure 8:
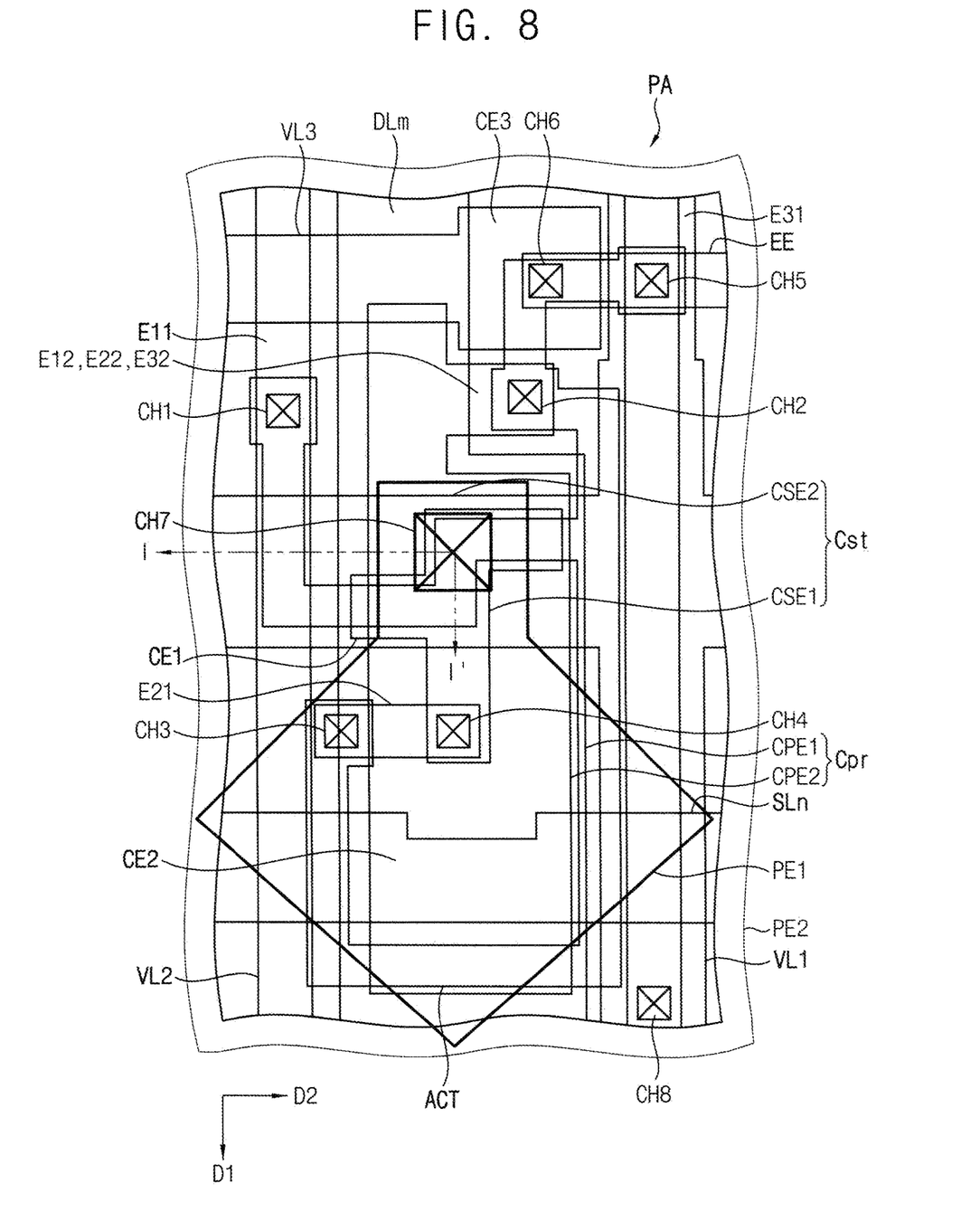

Referring to FIGS. 2, 3 and 8, a fourth insulating interlayer 116 may be disposed on the fourth conductive pattern. The fourth insulating interlayer 116 may be provided with a high thickness to sufficiently cover the fourth conductive pattern.

A seventh contact part CH7 in which the fourth insulating interlayer 116 is etched may be defined in the pixel circuit area PA.

A first pixel electrode PE1 may be disposed on the fourth insulating interlayer 116. The first pixel electrode PE1 may correspond to the anode electrode of the organic light emitting diode OLED.

A pixel defining layer 117 may be disposed on the fourth insulating interlayer 116 on which the first pixel electrode PE1 is disposed.

The pixel defining layer 117 may be etched to define an opening which exposes a portion area of the first pixel electrode PE1 and then, the organic light emitting layer EL may be disposed in the opening. Thus, the organic light emitting layer EL may be disposed on the first pixel electrode PE1 exposed through the opening of the pixel defined layer 117.

A second pixel electrode PE2 may be disposed on the organic light emitting layer EL. The second pixel electrode PE2 may correspond to the cathode electrode of the organic light emitting diode OLED (refer to FIG. 1). The second pixel electrode PE2 may be commonly disposed in the plurality of pixel circuit areas.

The spacer coating layer 300 may be disposed on the first display substrate 100.

Then, the first display substrate 100 on which the spacer coating layer 300 is formed, may be combined with the second display substrate 200. The second display substrate 200 may include a second base substrate 211 and a color filter layer CF.

Figure 9:
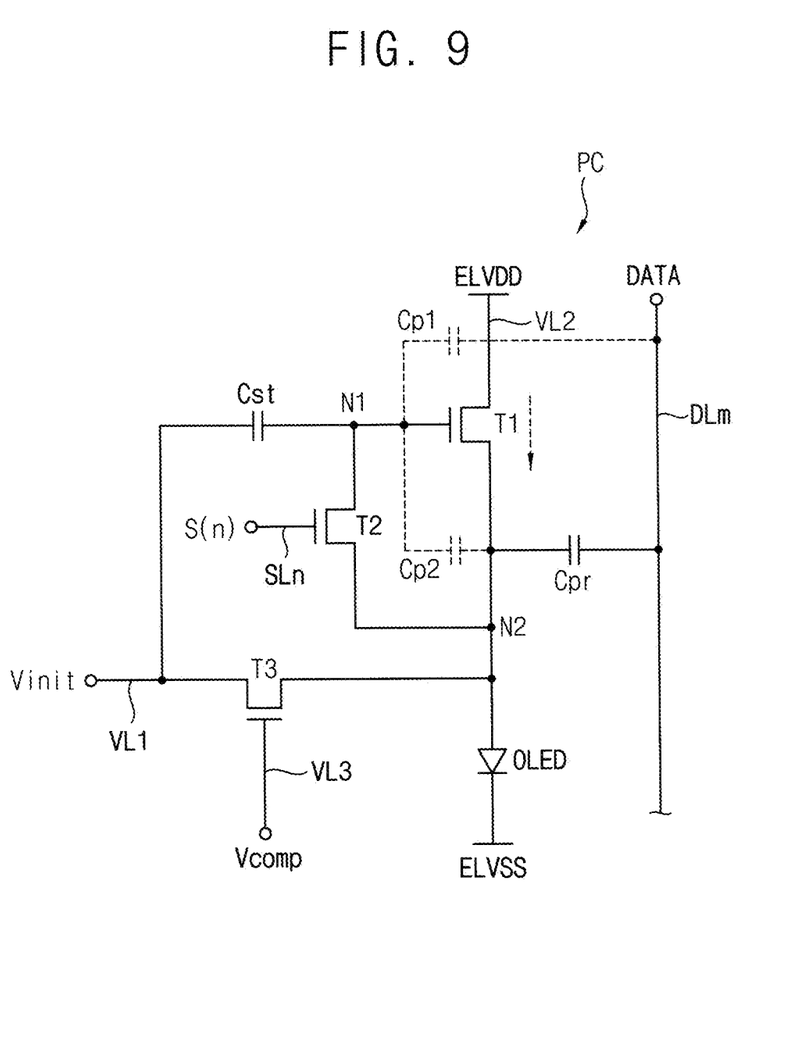
FIG. 9 is a diagram illustrating an exemplary embodiment of a method of driving a pixel circuit.
Figure 10:
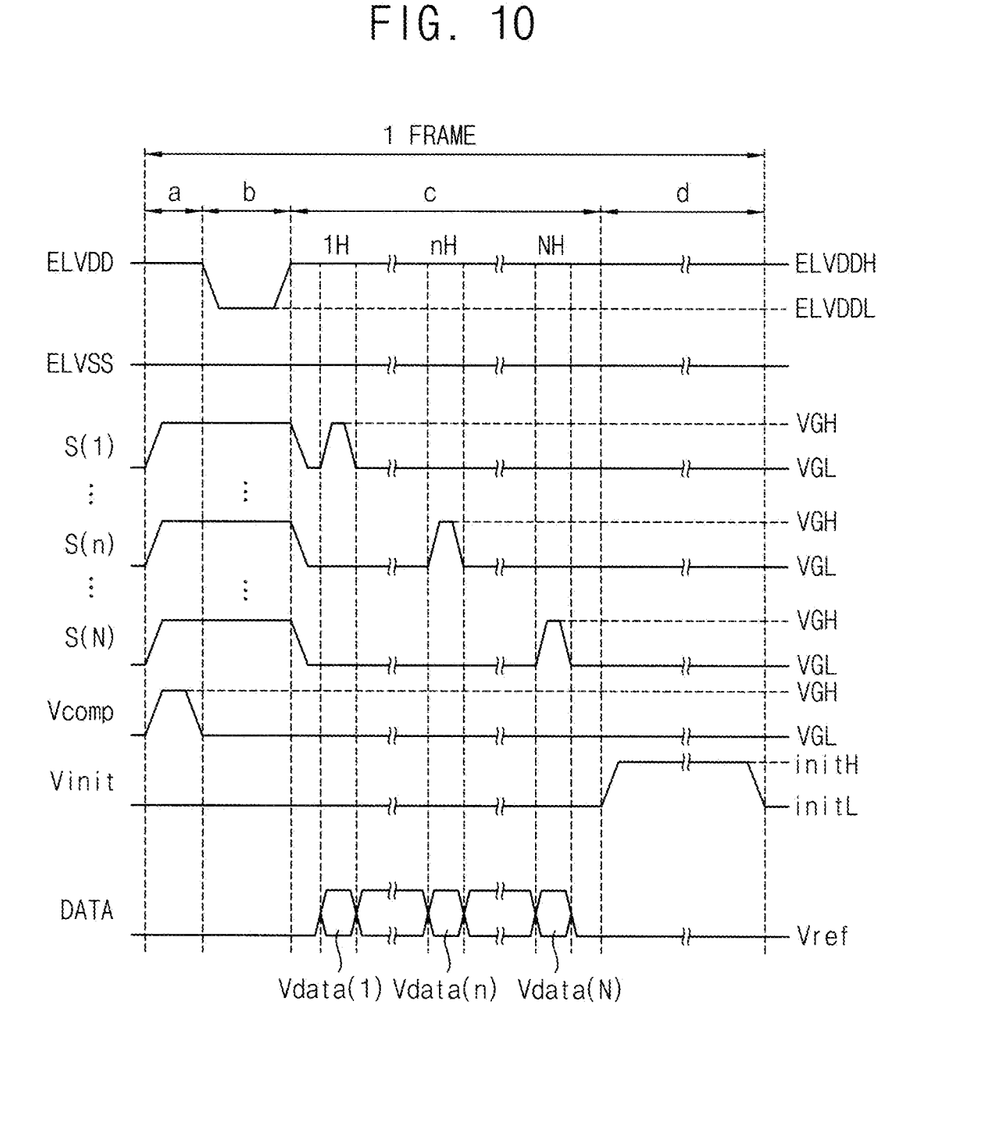
FIG. 10 is a waveform diagram illustrating an exemplary embodiment of a method of driving a pixel circuit.

FIG. 9 is a diagram illustrating a method of driving a pixel circuit according to an exemplary embodiment. FIG. 10 is a waveform diagram illustrating a method of driving a pixel circuit according to an exemplary embodiment.

Referring to FIGS. 9 and 10, the pixel circuit PC may receive a plurality of input signals. The plurality of input signals may include the first power source signal ELVDD applied to the second voltage line VL2, the first driving signal Vinit applied to the first voltage line VL1, the second driving signal Vcomp applied to the third voltage line VL3, an n-th scan signal S(n) applied to an n-th scan line SLn, a data voltage DATA applied to an m-th data line DLm and the second power source signal ELVSS applied to the cathode electrode of the organic light emitting diode OLED.

The frame period may include a first period 'a' during which the anode electrode of the organic light emitting diode OLED is initialized, a second period 'b' during which the threshold voltage of the first transistor T1 is compensated, a third period 'c' during which the data voltage DATA is applied to the pixel and a fourth period 'd' during which the organic light emitting diode OLED emit the light.

Referring to the first period 'a', the first voltage line VL1 receives a low voltage initL of the first driving signal Vinit.

The second voltage line VL2 receives a high voltage ELVDDH of the first power source signal ELVDD. The high voltage ELVDDH of the first power source signal ELVDD may have a voltage of a normal positive power source signal.

In an exemplary embodiment, the low voltage initL of the first driving signal Vinit may be about −2.2 volts (V), the high voltage ELVDDH of the first power source signal ELVDD may be about 7 V, the low voltage ELVDDL of the first power source signal ELVDD may be about −7 V, and the second power source signal ELVSS may be about 0 V, for example.

The third voltage line VL3 receives a high voltage VGH of the second driving signal Vcomp. The high voltage VGH of the second driving signal Vcomp may have a turn-on voltage for turning on the third transistor T3.

The n-th scan line SLn receives a high voltage VGH of the n-th scan signal S(n). The high voltage VGH of the n-th scan signal S(n) may have a turn-on voltage for turning on the second transistor T2. In an exemplary embodiment, the high voltage VGH of the scan signal may be about 10 V, for example.

The m-th data line DLm receives the reference voltage Vref. The reference voltage Vref may be equal to or lower than a lowest voltage in a voltage range of the data voltage DATA. In an exemplary embodiment, when the voltage range of the data voltage DATA is about 0.5 V to about 7.5 V, the reference voltage Vref may be equal to or lower than about 0.5 V, for example.

During the first period 'a', the anode electrodes of the organic light emitting diodes OLED in all pixels may be initialized by the low voltage initL of the first driving signal Vinit, simultaneously.

Referring to the second period 'b', the first voltage line VL1 receives the low voltage initL of the first driving signal Vinit.

The second voltage line VL2 receives a low voltage ELVDDL of the first power source signal ELVDD. In an exemplary embodiment, the low voltage ELVDDL of the first power source signal ELVDD may be about −7 V, for example.

The third voltage line VL3 receives a low voltage VGL of second driving signal Vcomp. The low voltage VGL of the second driving signal Vcomp may have a turn-off voltage for turning off the third transistor T3. In an exemplary embodiment, the low voltage VGL of the second driving signal Vcomp may be about −10 V, for example.

The n-th scan line SLn successively receives the high voltage VGH of the n-th scan signal S(n).

The m-th data line DLm successively receives the reference voltage Vref.

During the second period 'b', the threshold voltages of the first transistors T1 in all pixels may be simultaneously compensated using the sum voltage of the low voltage ELVDDL of the first power source signal ELVDD and the threshold voltage of corresponding first transistor T1.

Referring to the third period 'c', the first voltage line VL1 receives the low voltage initL of the first driving signal Vinit.

The second voltage line VL2 receives a high voltage ELVDDH of the first power source signal ELVDD.

The third voltage line VL3 receives the low voltage VGL of the second driving signal Vcomp.

The n-th scan line SLn receives the high voltage VGH of the n-th scan signal S(n) during an n-th horizontal period nH of the third period 'c'.

The m-th data line DLm receives a data voltage Vdata(n) in synchronization with the high voltage VGH of the n-th scan signal S(n).

During the n-th horizontal period nH, the first and second capacitors Cst and Cpr are connected to each other in series, the data voltage Vdata(n) corresponding to the n-th horizontal line is divided by a voltage division ratio of the first and second capacitors Cst and Cpr, and then the divided data voltage Vdata(n) is applied to the first node N1.

Referring to the plan view of the pixel circuit shown in FIG. 2, the m-th data line DLm overlaps the first control electrode CE1 and the first control electrode CE1 overlaps the fourth capacitor electrode CPE2 of the second capacitor Cpr that is the second node N2.

As described above, when the first control electrode CE1 that is the first node N1 overlaps the m-th data line DLm and the fourth capacitor electrode CPE2 of the second capacitor Cpr, a first parasitic capacitance Cp1 occurs between the m-th data line DLm and the first control electrode E11 and a second parasitic capacitance Cp2 occurs between the first control electrode E11 and the fourth capacitor electrode CPE2.

A voltage applied to the first node N1 may be increased by the first parasitic capacitance Cp1. Thus, a leakage current occurs by the first transistor T1. An anode voltage of the organic light emitting diode OLED may be increased by the leakage current. When the anode voltage of the organic light emitting diode OLED increase, a voltage applied to the first node N1 may be increased by the second parasitic capacitance Cp2.

Therefore, data coupling occurs by the first and second parasitic capacitances Cp1 and Cp2 and the organic light emitting diode OLED does not limit the light of a target luminance. Thus, a display quality may be decreased.

In contrast, according to the exemplary embodiment, a size of the first control electrode CE1 of the first transistor T1, that is the first node, may decrease so that the first and second parasitic capacitances Cp1 and Cp2 may decrease. Thus, the display quality may be improved.

In addition, the m-th data line DLm may receive the reference voltage Vref before a first horizontal period 1H in which a data voltage Vdata(1) corresponding to a first horizontal line (e.g., first scan line) among a plurality of horizontal lines (e.g., scan lines) is applied to the m-th data line DLm and after a last horizontal period, i.e., Nth horizontal period NH, in which a data voltage Vdata(N) corresponding to a last horizontal line (e.g., last scan line) among the plurality of horizontal lines is applied to the m-th data line DLm. Therefore, the plurality of data lines may be maintained into the reference voltage Vref during an early period and a latter period of the third period 'c'.

Referring to the fourth period 'd', the first voltage line VL1 receives a high voltage initH of the first driving signal Vinit.

A difference voltage between the high voltage initH and the low voltage initL of the first driving signal Vinit is applied to the first node N1, and then the first transistor T1 is turned on. The high voltage initH of the first driving signal Vinit may be determined based on a turn-on voltage of the first transistor T1.

In an exemplary embodiment, the high voltage initH of the first driving signal Vinit may be about 6.5 V, for example.

The second voltage line VL2 receives the high voltage ELVDDH of the first power source signal ELVDD.

The third voltage line VL3 receives the low voltage VGL of the second driving signal Vcomp. The n-th scan line SLn receives the low voltage VGL of the n-th scan signal S(n). The m-th data line DLm receives the reference voltage Vref During the fourth period 'd', driving current corresponding to the data voltage applied to the first node N1 may be provided to the organic light emitting diode OLED and the organic light emitting diode OLED may emit the light.

According to the exemplary embodiments, in the pixel structure of the high resolution including the data line overlapping a control electrode of the first transistor, the control electrode has a substantially same shape as that of the channel area of the first transistor overlapping the control electrode so that an overlap area of the data line and the channel area may decrease. Thus, the parasitic capacitance occurring by the control electrode and the data line may decrease and the display quality may be improved.

The invention may be applied to a display device and an electronic device including the display device. In an exemplary embodiment, the invention may be applied to various electronic devices such as a computer monitor, a laptop, a digital camera, a cellular phone, a smart phone, a smart pad, a television, a personal digital assistant ("PDA"), a portable multimedia player ("PMP"), a MP3 player, a navigation system, a game console, a video phone, etc.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display substrate comprising:
    a data line extending in a first direction;
    a first transistor comprising a first channel area overlapping the data line and a first control electrode which overlaps the first channel area, the first control electrode in a plan view has a same shape as, but wider than, that of the first channel area in an overlap area in which the first control electrode overlaps the first channel area;
    a scan line extending in a second direction crossing the first direction;
    a first voltage line which extends in the first direction and transfers a first driving signal;
    a first capacitor comprising an extension electrode which overlaps the first control electrode and extends in the second direction from the first voltage line; and a second capacitor comprising an overlap electrode overlapping the data line.

2. The display substrate of claim 1, further comprising:
a second voltage line which is connected to the first transistor and transfers the first power source signal,
wherein the data line is disposed between the first voltage line and the second voltage line adjacent to the first voltage line in the second direction.

3. The display substrate of claim 2, further comprising:
a second transistor comprising a second control electrode connected to the scan line, a first electrode connected to the first control electrode and a second electrode connected to the overlap electrode;
a third voltage line which is parallel with the scan line and transfers a second driving signal; and
a third transistor comprising a third control electrode connected to the third voltage line, a first electrode connected to the first voltage line and a second electrode connected to the overlap electrode.

4. The display substrate of claim 1, further comprising:
a first insulating interlayer disposed between the first control electrode and the extension electrode and comprising a high dielectric constant material.

5. The display substrate of claim 4, further comprising:
a second insulating interlayer disposed between the extension electrode and the data line; and
a third insulating interlayer disposed between the data line and the overlap electrode.

6. The display substrate of claim 1, further comprising:
an organic light emitting diode comprising an anode electrode connected to the overlap electrode, a cathode electrode which receives a second power source signal and an organic light emitting layer disposed between the anode electrode and the cathode electrode.

7. A display apparatus comprising:
a first display substrate comprising an m-th data line extending in a first direction, a first transistor comprising a first channel area overlapping the m-th data line and a first control electrode which overlaps the first channel area, the first control electrode in a plan view has a same shape as, but wider than, that of the first channel area in an overlap area in which the first control electrode overlaps the first channel area, an n-th scan line which extends in a second direction crossing the first direction and receives a scan signal, a first capacitor comprising an extension electrode overlapping the first control electrode, a second capacitor comprising an overlap electrode overlapping the m-th data line, and an organic light emitting diode comprising an anode electrode connected to the overlap electrode and an organic light emitting layer; and
a second display substrate opposing to the first display substrate.

8. The display apparatus of claim 7, wherein the first display substrate further comprises:
a first voltage line which extends in the first direction and transfers a first driving signal; and
a second voltage line which is connected to the first transistor and transfers a first power source signal,
wherein the m-th data line is disposed between the first voltage line and the second voltage line adjacent to the first voltage line in the second direction.

9. The display apparatus of claim 8, wherein the first display substrate further comprises:
a second transistor comprising a second control electrode connected to the n-th scan line, a first electrode connected to the first control electrode and a second electrode connected to the overlap electrode;
a third voltage line which is parallel with the n-th scan line and transfers a second driving signal; and
a third transistor comprising a third control electrode connected to the third voltage line, a first electrode connected to the first voltage line and a second electrode connected to the overlap electrode.

10. The display apparatus of claim 7, wherein the first display substrate further comprises a first insulating interlayer disposed between the first control electrode and the extension electrode, and
wherein the first insulating interlayer comprises a high dielectric constant material.

11. The display apparatus of claim 10, wherein, the first display substrate further comprises:
a second insulating interlayer disposed between the extension electrode and the m-th data line; and
a third insulating interlayer disposed between the m-th data line and the overlap electrode.

12. The display apparatus of claim 9, wherein, during a first period of a frame period, the first voltage line receives a low voltage of the first driving signal, the second voltage line receives a high voltage of the first power source signal, the third voltage line receives a high voltage of the second driving signal, and the n-th scan line receives a high voltage of the scan signal.

13. The display apparatus of claim 12, wherein, during a second period of the frame period, the first voltage line receives the low voltage of the first driving signal, the second voltage line receives a low voltage of the first power source signal lower than the low voltage of the first driving signal, the third voltage line receives a low voltage of the second driving signal, and the n-th scan line receives the high voltage of the scan signal.

14. The display apparatus of claim 13, wherein, during a third period of the frame period, the first voltage line receives the low voltage of the first driving signal, the second voltage line receives the high voltage of the first power source signal, the third voltage line receives the low voltage of the second driving signal, the n-th scan line receives the high voltage of the scan signal during an n-th horizontal period of the third period, and the m-th data line receives a data voltage corresponding to an n-th horizontal line.

15. The display apparatus of claim 14, wherein during the n-th horizontal period, the first and second capacitors are connected to each other in series,
wherein the data voltage corresponding to the n-th horizontal line is divided by a voltage division ratio of the first and second capacitors and the divided data voltage is applied to the first control electrode.

16. The display apparatus of claim 14, wherein the m-th data line receives a reference voltage before a data voltage corresponding to a first horizontal line of a plurality of horizontal lines is applied to the m-th data line, and after a data voltage corresponding to a last horizontal line of the plurality of horizontal lines is applied to the m-th data line.

17. The display apparatus of claim 16, wherein the m-th data line receives the reference voltage before the first voltage line receives the high voltage of the first driving signal,
wherein the reference voltage is equal to or lower than a lowest voltage of a data voltage range.

18. The display apparatus of claim 14, wherein during a fourth period of the frame period, the first voltage line receives a high voltage of the first driving signal, the second voltage line receives the high voltage of the first power source signal, the third voltage line receives the low voltage of the second driving signal, and the n-th scan line receives a low voltage of the scan signal.

19. The display apparatus of claim 18, wherein a difference voltage between the high voltage and the low voltage of the first driving signal is applied to the first control electrode, and a driving current corresponding to the data voltage which is applied to the first control electrode is applied to the organic light emitting diode when the first transistor is turned on.

20. The display apparatus of claim 7, wherein the first transistor in the first display substrate is an N-type transistor.

* * * * *